United States Patent
Chang et al.

(10) Patent No.: US 11,296,034 B2
(45) Date of Patent: Apr. 5, 2022

(54) SUBSTRATE AND SEMICONDUCTOR PACKAGE COMPRISING AN INTERPOSER ELEMENT WITH A SLOT AND METHOD OF MANUFACTURING THE SAME

(71) Applicant: Advanced Semiconductor Engineering, Inc., Kaohsiung (TW)

(72) Inventors: Wei-Hao Chang, Kaohsiung (TW); Yi Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/905,912

(22) Filed: Jun. 18, 2020

(65) Prior Publication Data
US 2021/0398907 A1    Dec. 23, 2021

(51) Int. Cl.
| | |
|---|---|
| *H01L 23/34* | (2006.01) |
| *H01L 23/48* | (2006.01) |
| *H01L 23/28* | (2006.01) |
| *H01L 21/00* | (2006.01) |
| *H05K 1/00* | (2006.01) |
| *H05K 7/00* | (2006.01) |
| *H05K 1/14* | (2006.01) |
| *H01L 23/538* | (2006.01) |
| *H01L 23/31* | (2006.01) |
| *H01L 21/78* | (2006.01) |
| *H01L 21/48* | (2006.01) |
| *H01L 21/56* | (2006.01) |

(Continued)

(52) U.S. Cl.
CPC ...... *H01L 23/5389* (2013.01); *H01L 21/4853* (2013.01); *H01L 21/565* (2013.01); *H01L 21/78* (2013.01); *H01L 23/3121* (2013.01); *H01L 23/49838* (2013.01); *H01L 23/5385* (2013.01); *H01L 23/5386* (2013.01); *H01L 24/97* (2013.01); *H01L 25/0657* (2013.01); *H01L 2924/181* (2013.01)

(58) Field of Classification Search
CPC ............. H01L 2224/97; H01L 25/0657; H01L 23/49838; H01L 2924/181; H01L 24/97; H01L 23/5389; H01L 23/3121; H01L 23/5385; H01L 23/5386; H01L 21/4853; H01L 21/565; H01L 21/78
See application file for complete search history.

(56) References Cited

U.S. PATENT DOCUMENTS 6,720,666 B2 *   4/2004   Lim ...................... H01L 24/06
                                                        257/786
7,443,041 B2 * 10/2008   Khiang ................. H01L 21/565
                                                        257/784

(Continued)

*Primary Examiner* — Alonzo Chambliss
(74) *Attorney, Agent, or Firm* — Foley & Lardner LLP

(57) ABSTRACT

A substrate, a semiconductor package, and a method of manufacturing the same are provided. The substrate includes an interposer element. The interposer element has a first surface and a second surface opposite to the first surface. At least two rows of pads are disposed adjacent to the first surface of the interposer element. The interposer element includes at least one slot disposed between the two rows of pads and extending from the first surface to the second surface, wherein a projection area extending from an edge of the slot to an edge of the first surface of the interpose element is nonoverlapping at least one pad.

9 Claims, 17 Drawing Sheets

(51) Int. Cl.
*H01L 23/498* (2006.01)
*H01L 23/00* (2006.01)
*H01L 25/065* (2006.01)

(56) References Cited

U.S. PATENT DOCUMENTS

| | | | | |
|---|---|---|---|---|
| 7,498,679 | B2* | 3/2009 | Ryu | H01L 23/13 257/782 |
| 7,750,456 | B2* | 7/2010 | Roh | H01L 23/13 257/687 |
| 9,192,051 | B2 | 11/2015 | Yamamoto | |
| 9,337,135 | B2* | 5/2016 | Lii | H01L 25/0657 |
| 10,356,903 | B1 | 7/2019 | Chen et al. | |
| 2004/0200063 | A1* | 10/2004 | Thurgood | H01L 23/13 29/830 |
| 2006/0006513 | A1* | 1/2006 | Fee | H01L 24/97 257/680 |
| 2006/0043583 | A1* | 3/2006 | Tamagawa | H01L 25/0652 257/720 |
| 2006/0205117 | A1* | 9/2006 | Grigg | H01L 23/49827 438/118 |
| 2010/0258927 | A1* | 10/2010 | Ganesan | H01L 21/50 257/686 |
| 2010/0289141 | A1* | 11/2010 | Takeda | H01L 23/13 257/738 |
| 2011/0169173 | A1* | 7/2011 | Mun | H01L 23/49838 257/783 |
| 2012/0159118 | A1* | 6/2012 | Wong | H01L 25/105 712/1 |
| 2013/0292853 | A1* | 11/2013 | Ye | H01L 25/50 257/777 |
| 2014/0239514 | A1* | 8/2014 | Haba | H01L 24/49 257/778 |
| 2014/0264811 | A1* | 9/2014 | Wu | H01L 25/50 257/686 |
| 2014/0264857 | A1* | 9/2014 | Wu | H01L 24/19 257/738 |
| 2016/0197033 | A1* | 7/2016 | Lin | H05K 3/4697 257/737 |

* cited by examiner

SUBSTRATE AND SEMICONDUCTOR PACKAGE COMPRISING AN INTERPOSER ELEMENT WITH A SLOT AND METHOD OF MANUFACTURING THE SAME

BACKGROUND

1. Technical Field

The present disclosure relates to a substrate, a semiconductor package, and a method of manufacturing the same, and more particularly, to a substrate, a semiconductor package, and a method of manufacturing the same that can improve reliability of internal electrical connections.

2. Description of the Related Art

Nowadays, techniques for incorporating more than one semiconductor substrates into a single semiconductor package to provide more functions are under progressively development. One semiconductor substrate (such as a unit substrate) may be stacked onto another by an interposer element. The interposer element may provide electrical connections between the semiconductor substrates. Therefore, it would be desirable to provide an interposer element which may allow the semiconductor substrates to stack onto each other with reliable electrical connections where the semiconductor substrates can function properly or can achieve the required performances.

SUMMARY

In an aspect, a substrate includes an interposer element. The interposer element has a first surface and a second surface opposite to the first surface. At least two rows of pads are disposed adjacent to the first surface of the interposer element. The interposer element includes at least one slot disposed between the two rows of pads and extending from the first surface to the second surface, wherein a projection area extending from an edge of the slot to an edge of the first surface of the interposer element is nonoverlapping at least one pad.

In an aspect, a semiconductor package includes a substrate, an electronic component, an interposer element, and an encapsulant. The first substrate has a first surface. The electronic component is disposed adjacent to the first surface of the first substrate. The interposer element is disposed adjacent to the first surface of the first substrate. The interposer element has a first surface corresponding to the first surface of the first substrate, a second surface opposite to the first surface of the interposer element, and a slot extending from the first surface to the second surface of the interposer element. The encapsulant covers at least a portion of the first substrate and at least a portion of the interposer element, where a portion of the encapsulant is disposed in the slot.

In an aspect, a method of manufacturing a semiconductor package includes: providing an interposer element, the interposer element having a first surface, a second surface opposite to the first surface, and a slot extending from the first surface to the second surface; disposing the interposer element adjacent to a first substrate; disposing a second substrate adjacent to the interposer element; and flowing an encapsulant through the slot.

BRIEF DESCRIPTION OF THE DRAWINGS

FIG. 9B-2 illustrates a top view of FIG. 9B-1 according to some embodiments of the present disclosure. FIG. 9C-2 illustrates a top view of FIG. 9C-1 according to some embodiments of the present disclosure. FIG. 9D-2 illustrates a top view of FIG. 9D-1 according to some embodiments of the present disclosure. FIG. 9E-2 illustrates a top view of FIG. 9E-1 according to some embodiments of the present disclosure.

FIG. 10A, FIG. 10B, FIG. 10C-1, FIG. 10D-1, FIG. 10E-1, and FIG. 10F illustrate a method of manufacturing a semiconductor package such as the semiconductor package of FIG. 6. FIG. 10C-2 illustrates a top view of FIG. 10C-1 according to some embodiments of the present disclosure. FIG. 10D-2 illustrates a top view of FIG. 10D-1 according to some embodiments of the present disclosure. FIG. 10E-2 illustrates a top view of FIG. 10E-1 according to some embodiments of the present disclosure.

DETAILED DESCRIPTION

Spatial descriptions, such as "upper," "lower," "top," "bottom," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

In some embodiments, the present disclosure provides a substrate, a semiconductor package, and a method of manufacturing the same. The substrate includes at least one interposer element. At least two rows of pads are disposed adjacent to a first surface of the interposer element. The interposer element includes at least one slot disposed between the two rows of pads and extending from the first surface to the second surface opposite to the first surface, so when the interposer element is disposed adjacent to a substrate and a molding process is performed, a molding compound and a filler may be able to flow through the slot and expand from the central area between the interposer element and the substrate to the periphery area. By this technique, voids occurred around the electrical connector between the interposer element and the substrate during a conventional molding technique may be reduced or eliminated. Accordingly, the reliability of the electrical connector may be improved.

Figure 1A:
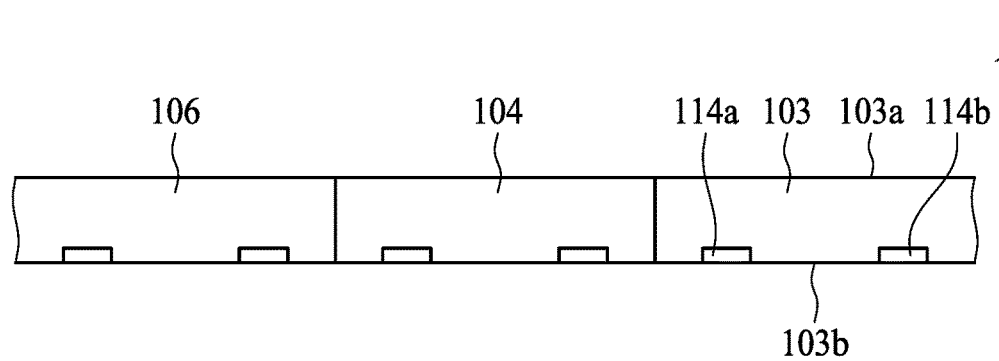
FIG. 1(a) illustrates a cross-sectional view of a substrate according to some embodiments of the present disclosure.
Figure 1B:
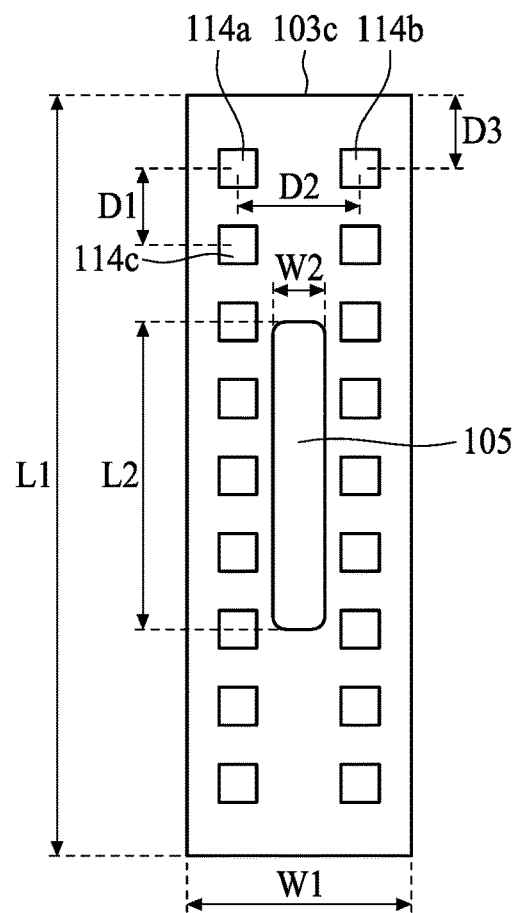
FIG. 1(b) illustrates a bottom view of an interposer element illustrated in FIG. 1(a).

FIG. 1(a) illustrates a cross-sectional view of a substrate according to some embodiments of the present disclosure. The substrate 100 of FIG. 1(a) includes at least one interposer element 103, 104, 106. FIG. 1(b) illustrates a bottom view of an interposer element 103 illustrated in FIG. 1(a).

The interposer element 103 has a first surface 103b and a second surface 103a opposite to the first surface 103b. The interposer element 103 may have a first length L1 and a first width W1. The interposer element 103 may include a substrate material that can be glass, silicon, metal, a metal alloy, a polymer, or other suitable material. In some embodiments, the interposer element 103 includes silicon.

A plurality of first pads 114a, 114b, 114c may be further disposed adjacent to the first surface 103b of the interpose element 103 for providing electrical connections to external environment. The plurality of first pads 114a, 114b, 114c may be disclosed in two rows along with the long side of the interposer element 103 (i.e., the L1 direction). The first pads 114a, 114c disposed adjacent to each other in line with the long side of the interposer element 103 (i.e. the L1 direction) may be spaced from each other by a distance D1 (e.g., a center to center distance or a pad pitch). The first pads 114a, 114b disposed adjacent to each other in line with the short side of the interposer element 103 (i.e. the W1 direction) may be spaced from each other by a distance D2 (e.g., a center to center distance or a pad pitch). D1 may be substantially equal to or different from D2. In some embodiments, D2 is substantially equal to D1. In some embodiments, the pad pitch is from about 0.35 mm to about 0.8 mm. The outmost first pad 114a, 114b in the rows may be spaced from the edge 103c of the interposer element 103 by a distance D3 (e.g., a center to edge distance). The first pad 114a, 114b, 114c may be, for example, a contact pad of a trace or a ball pad. In some embodiments, the first pad 114a, 114b, 114c is a ball pad.

The interposer element 103 may include at least one slot 105 extending from the second surface 103a to the first surface 103b. The slot 105 may have a second length L2 and a second width W2. The second length L2 may be substantially the same with or different from the second width W2. In some embodiments, the second length L2 is larger than the second width W2. The first length L1 is larger than the second length L2 and the first width W1 is larger than the second width W2. The second width W2 should be smaller than the distance D2 between the centers of the first pads 114a, 114b disposed adjacent to each other in line with the short side of the interposer element 103 so that the slot 105 can be disposed between the two rows of the first pads 114a, 114b. In addition, the second width W2 should be sufficiently wide so as to allow a molding compound and/or a filler to flow through. In some embodiments, the second width W2 is larger than an average size of the fillers. In some embodiments, the second width W2 is smaller than the pad pitch.

The slot 105 may be disposed between the two rows of the first pads 114a, 114b. The slot 105 may be disposed adjacent to an area of the interposer element 103 which corresponds to an area where a void(s) may be produced around the first pads 114a, 114b during the subsequent molding process (e.g., a encapsulating process) so as to reduce or eliminate their occurrence. In some embodiments, the slot 105 is disposed adjacent to a center of the interposer element 103. In some embodiments, the slot 105 is disposed adjacent to an edge 103c of the interposer element 103. In some embodiments, the slot 105 is disposed extending from the edge 103c of the interposer element 103 toward the center of the interposer element 103. In some embodiments, at least one of the slots 105 is disposed adjacent to the center of the interposer element 103 and at least one of the slots 105 is disposed adjacent to the edge 103c of the interposer element 103. In some embodiments, the slot 105 is disposed at a position where a projection area extending from an edge of the slot 105 to an edge of the first surface 103b is nonoverlapping/without overlapping at least one pad. In some embodiments, the second length L2=the first length L1−2 (2*pad pitch+D3).

A plurality of electrical connectors may be further disposed adjacent to the first surface 103b of the interposer element 103. In some embodiments the electrical connector electrically connects to the corresponding first pad 114a, 114b. In some embodiments, the electrical connector is disposed on (e.g., physical contact) the corresponding first pad 114a, 114b. The electrical connector may be a pillar or a solder/stud bump. In some embodiments, the electrical connector is a solder bump.

Figure 2A:
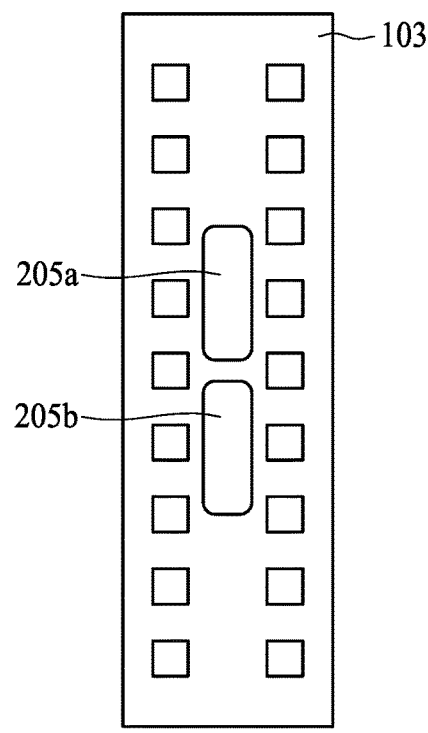
FIG. 2(a) illustrates a bottom view of an interposer element illustrated in FIG. 1(a) according to some embodiments of the present disclosure.

FIG. 2(a) illustrates a bottom view of an interposer element 103 illustrated in FIG. 1(a) according to some embodiments of the present disclosure. The interposer element 103 illustrated in FIG. 2(a) is similar to that illustrated in FIG. 1(a) and FIG. 1(b) with a difference including that the interposer element 103 includes two slots 205a, 205b and the two slots 205a, 205b are disposed adjacent to a center of the interposer element 103.

Figure 2B:
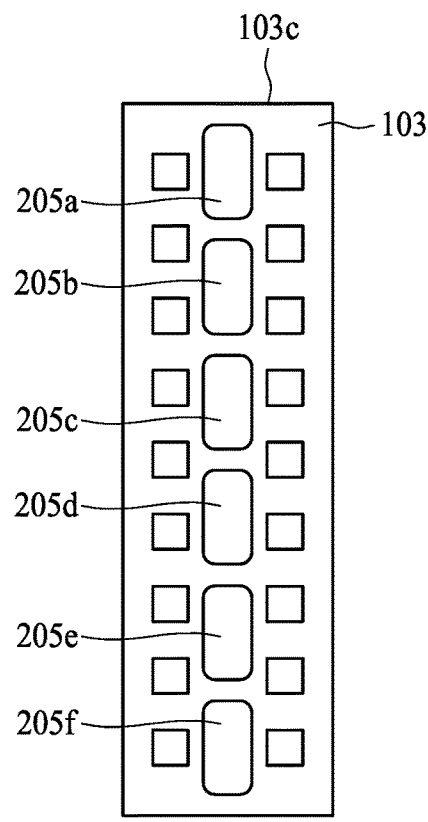
FIG. 2(b) illustrates a bottom view of an interposer element illustrated in FIG. 1(a) according to some embodiments of the present disclosure.

FIG. 2(b) illustrates a bottom view of an interposer element 103 illustrated in FIG. 1(a) according to some embodiments of the present disclosure. The interposer element 103 illustrated in FIG. 2(b) is similar to that illustrated in FIG. 1(a) and FIG. 1(b) with a difference including that the interposer element 103 includes six slots 205a, 205b, 205c, 205d, 205e, 205f and at least one of the slots 205a, 205b, 205c, 205d, 205e, 205f is disposed adjacent to an edge 103c of the interposer element 103 and at least one of the slots 205a, 205b, 205c, 205d, 205e, 205f is disposed adjacent to a center of the interposer element 103.

Figure 2C:
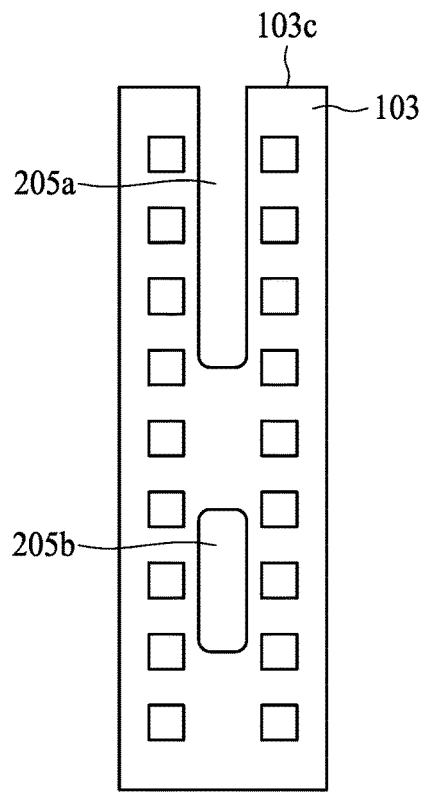
FIG. 2(c) illustrates a bottom view of an interposer element illustrated in FIG. 1(a) according to some embodiments of the present disclosure.

FIG. 2(c) illustrates a bottom view of an interposer element 103 illustrated in FIG. 1(a) according to some embodiments of the present disclosure. The interposer element 103 illustrated in FIG. 2(c) is similar to that illustrated in FIG. 1(a) and FIG. 1(b) with a difference including that the interposer element 103 includes two slots 205a, 205b and one of the two slots 205a, 205b extends from an edge 103c of the interposer element 103 toward a center of the interposer element 103 and the other slot 205b is disposed adjacent to the center of the interposer element 103.

Figure 2D:
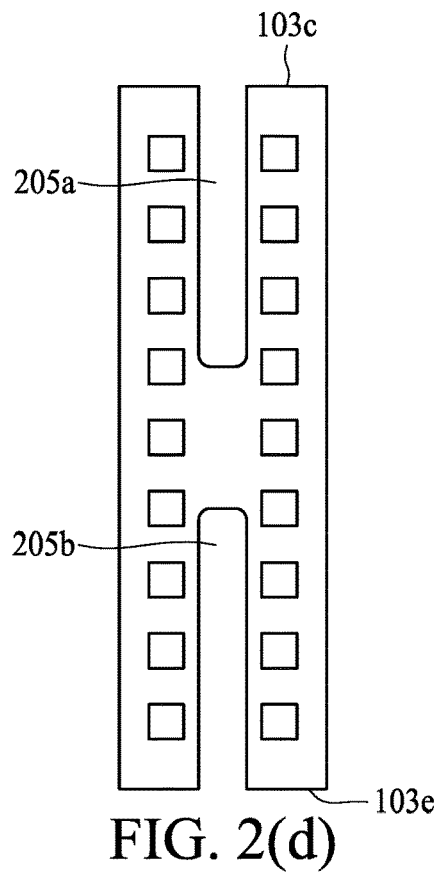
FIG. 2(d) illustrates a bottom view of an interposer element illustrated in FIG. 1(a) according to some embodiments of the present disclosure.

FIG. 2(d) illustrates a bottom view of an interposer element 103 illustrated in FIG. 1(a) according to some embodiments of the present disclosure. The interposer element 103 illustrated in FIG. 2(d) is similar to that illustrated in FIG. 1(a) and FIG. 1(b) with a difference including that the interposer element 103 includes two slots 205a, 205b and one of the two slots 205a, 205b extends from an edge 103c of the interposer element 103 toward a center of the interposer element 103 and the other slot 205b extends from the opposite edge 103e of the interposer element 103 toward a center of the interposer element 103.

Figure 3:
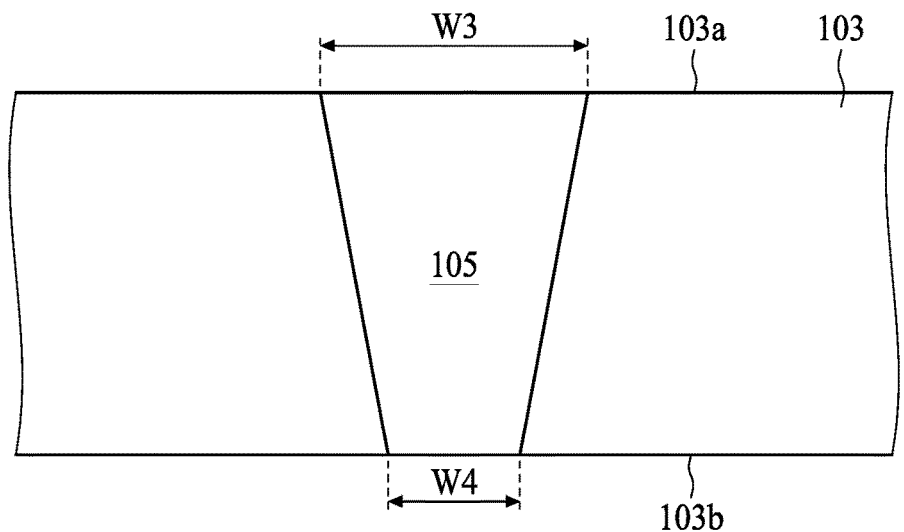
FIG. 3 illustrates a cross-sectional view of an interposer element according to some embodiments of the present disclosure.

FIG. 3 illustrates a cross-sectional view of an interposer element according to some embodiments of the present disclosure. The interposer element 103 of FIG. 3 has a first surface 103b and a second surface 103a opposite to the first surface 103b. The interposer element 103 includes at least one slot 105 extending from the first surface 103b to the second surface 103a. The slot 105 has a third width W3 at the second surface 103a and a fourth width W4 at the first surface 103b. The third width W3 may be substantially the same with or different from the fourth width W4. In some embodiments, the third width W3 is larger than the fourth width W4 (e.g., when the slot 105 is formed by applying a laser drilling technique from the second surface 103a toward the first surface 103b). In some embodiments, the fourth width W4 is larger than the third width W3 (e.g., when the slot 105 is formed by applying a laser drilling technique from the first surface 103b toward the second surface 103a). In some embodiments, the third width W3 is substantially the same with the fourth width W4 (e.g., when the slot 105 is formed by applying a mechanical drilling technique).

Figure 4:
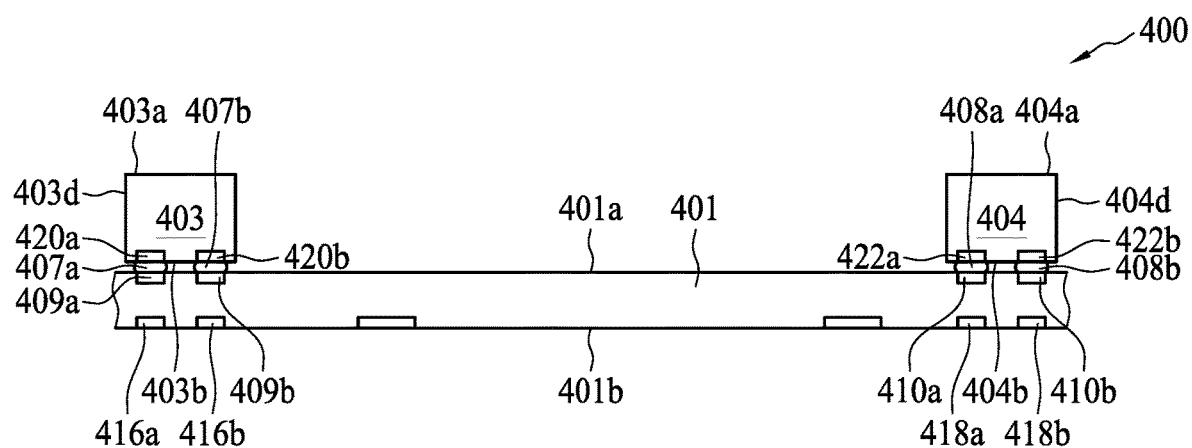
FIG. 4 illustrates a cross-sectional view of a semiconductor package according to some embodiments of the present disclosure.

FIG. 4 illustrates a cross-sectional view of a semiconductor package according to some embodiments of the present disclosure. The semiconductor package 400 of FIG. 4 includes a first substrate 401 and at least one interposer element 403, 404.

The first substrate 401 has a first surface 401a and a second surface 401b opposite to the first surface 401a. The first substrate 401 may be a printed circuit board, a unit substrate, a strip substrate, or a combination thereof. A unit substrate may include, for example, a unit chip (e.g., a communication chip, a microprocessor chip, a graphics chip, or a microelectromechanical systems (MEMS) chip diced from a wafer), a unit package, a unit interposer, or a combination thereof. A strip substrate may include, for example, a plurality of unit substrates, unit chips (e.g., a communication chip, a microprocessor chip, a graphics chip, or a microelectromechanical systems (MEMS) chip diced from a wafer), unit packages, unit interposers, or a combination thereof. In some embodiments, the first substrate 401 is a strip substrate. In some embodiments, the first substrate 401 is a unit substrate after singularizing. The first substrate 401 may include at least one second pad 409a, 409b, 410a, 410b. The second pad 409a, 409b, 410a, 410 may be disposed adjacent to the first surface 401a of the first substrate 401. In some embodiments, the second pad 409a, 409b, 410a, 410b is disposed on (e.g., physical contact or embedded in and exposed by) the first surface 401a of the first substrate 401. The second pad 409a, 409b, 410a, 410 may be, for example, a contact pad of a trace or a ball pad. In some embodiments, the second pad 409a, 409b, 410a, 410 is a ball pad. The first substrate 401 may further include at least one first pad 416a, 416b, 418a, 418b. The first pad 416a, 416b, 418a, 418b may be disposed adjacent to the second surface 401b of the first substrate 401 for providing external electrical connections. In some embodiments, the first pad 416a, 416b, 418a, 418b is disposed on (e.g., physical contact or embedded in and exposed by) the second surface 401b of the first substrate 401. The first pad 416a, 416b, 418a, 418b may be, for example, a contact pad of a trace or a ball pad. In some embodiments, the first pad 416a, 416b, 418a, 418b is a ball pad.

The interposer element 403, 404 has a first surface 403b, 404b, a second surface 403a, 404a, and an interposer side surface 403d, 404d extending from the second surface 403a, 404a to the first surface 403b, 404b. The interposer element 403, 404 is disposed adjacent to the first surface 401a of the first substrate 401. In some embodiments, the interposer element 403, 404 electrically connects to the first surface 401a of the first substrate 401. In some embodiments, the interposer element 403, 404 electrically connects to the first surface 401a of the first substrate 401 through the first electrical connector 407a, 407b, 408a, 408b disposed between the first pads 420a, 420b, 422a, 422b disposed adjacent to the first surface 403b, 404b of the interposer element 403, 404 and the second pad 409a, 409b, 410a, 410 disposed adjacent to the first surface 401a of the first substrate 401. The structure, configuration, and material of the interposer element 403, 404 are similar to those illustrated in FIG. 1(a), 1(b), FIG. 2(a)-2(d), and FIG. 3, which are not described repeatedly for brevity.

Figure 5A:
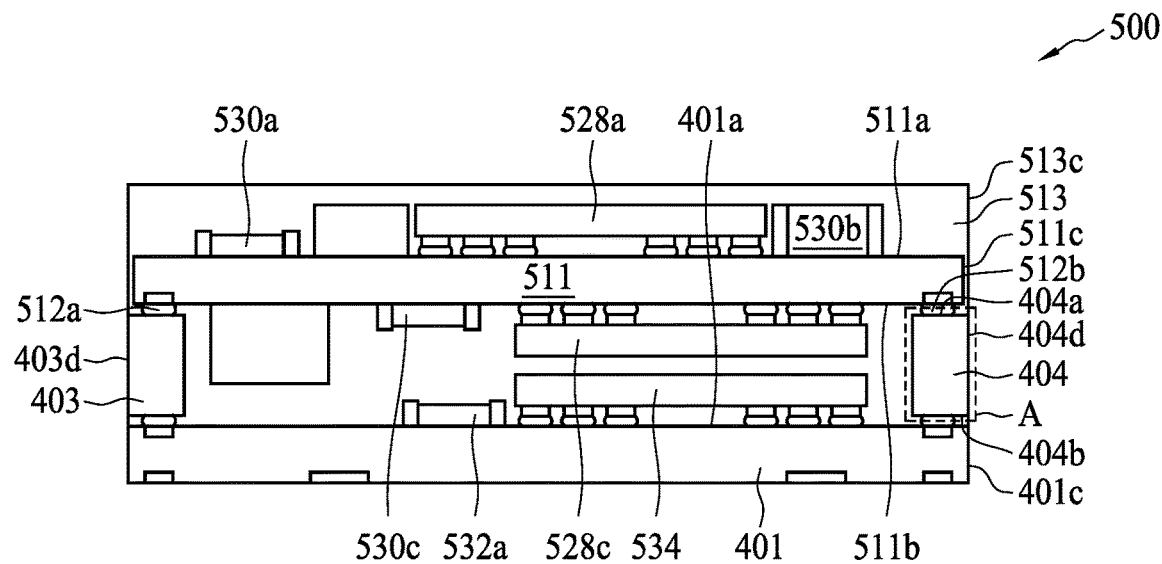
FIG. 5(a) illustrates a cross-sectional view of a semiconductor package according to some embodiments of the present disclosure.

FIG. 5(a) illustrates a cross-sectional view of a semiconductor package according to some embodiments of the present disclosure. The semiconductor package 500 illustrated in FIG. 5(a) is similar to that illustrated in FIG. 4 with a difference including that the semiconductor package 500 further includes a second substrate 511, an electronic component 528a, 528c, 530a, 530b, 530c, 532a, 534, and an encapsulant 513.

The second substrate 511 has a first surface 511a, a second surface 511b opposite to the first surface 511a, and a second substrate side surface 511c extending from the first surface 511a to the second surface 511b. The second substrate 511 may be shorter than the first substrate 401 in length so as to provide more space above the interposer element 403, 404 to allow the molding compound and filler to flow faster above the interposer element 403, 404 so the interposer element 403, 404 may be covered by the molding compound and filler faster and more completely. In some embodiments, a projection area of the second substrate 511 does not overlap the slot of the interposer element 403, 404.

The second substrate 511 may be disposed adjacent to the interposer element 403, 404. In some embodiments, the second semiconductor element 511 electrically connects to the interposer element 403, 404. In some embodiments, the second semiconductor element 511 electrically connects to the interposer element 403, 404 through the second electrical connector 512a, 512b. The second substrate 511 may be a printed circuit board, a unit substrate, or a combination thereof. A unit substrate may include, for example, a unit chip (e.g., a communication chip, a microprocessor chip, a graphics chip, or a microelectromechanical systems (MEMS) chip diced from a wafer), a unit package, a unit interposer, or a combination thereof. In some embodiments, the second substrate 511 is a unit substrate and the first substrate 401 is a strip substrate. In some embodiments, the second substrate 511 is a unit substrate and the first substrate 401 is also a unit substrate with corresponding size after singularizing The electronic component 528a, 528c, 530a, 530b, 530c, 532a, 534 may include an active component active component 528a, 528c, 534 (e.g., a die or a chip) and a passive component 530a, 530b, 530c, 532a (e.g., a capacitor, an inductor, or a resistor). The electronic component 528a, 528c, 530a, 530b, 530c, 532a, 534 may be disposed adjacent to at least one of the first surface 511a and the second surface 511b of the second substrate 511 and the first surface 401a of the first substrate 401. In some embodiments, the electronic component 528a, 528c, 530a, 530b, 530c, 532a, 534 is disposed adjacent to the first surface 511a and the second surface 511b of the second substrate 511 and the first surface 401a of the first substrate 401. In some embodiments, at least one passive component 530a, 530b and at least one active component 528a is disposed adjacent to the first surface 511a and at least one passive component 530c and at least one active component 528c is disposed adjacent to the second surface 511b of the second semiconductor element 511, and at least one passive component 532a and at least one active component 534 is disposed adjacent to the first surface 401a of the first semiconductor element 401.

The encapsulant 513 is disposed adjacent to the first substrate 401, the interposer element 403, 404, and the second substrate 511. In some embodiments, the encapsulant 513 covers at least a portion of the first surface 401a of the first substrate 401, at least a portion of the first surface 511a of the second substrate 511, and at least a portion of the second substrate side surface 511c. In some embodiments, the encapsulant 513 surrounds the second substrate side surface 511c of the second substrate 511. In some embodiments, the second substrate side surface 511c is exposed from the encapsulant 513. In some embodiments, an encapsulant side surface 513c of the encapsulant 513 is substantially coplanar with the first substrate side surface 401c of the first substrate. The encapsulant 513 may be, for example, a solder mask (the material of which is, for example, polyimide (PI)), a passivation layer (the material of which is, for example, a metal oxide), or an underfill. The encapsulant 513 may include fillers, the material of which is, for example, silica and/or carbon for reducing stress on the substrate and warpage of a resulting semiconductor package.

Figure 5B:
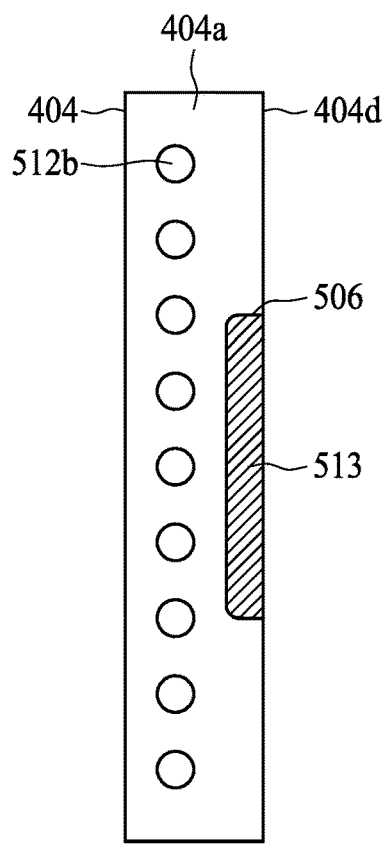
FIG. 5(b) illustrates a top view of region A of an interposer element illustrated in FIG. 5(a) according to some embodiments of the present disclosure.

FIG. 5(b) illustrates a top view of region A of an interposer element illustrated in FIG. 5(a) according to some embodiments of the present disclosure. The interposer element 404 may include a side surface 404d extending from the first surface 404b to the second surface 404a. The side surface 404d may be substantially coplanar with the first substrate side surface 401c of the first substrate 401 after singularizing. The side surface 404d of the interposer element 404 may have at least one recess 506. In some embodiments, a portion of the encapsulant 513 is in the recess 506. In some embodiments, the encapsulant 513 in the slot has a surface exposed from second surface 404a of the interposer element 404.

Figure 6A:
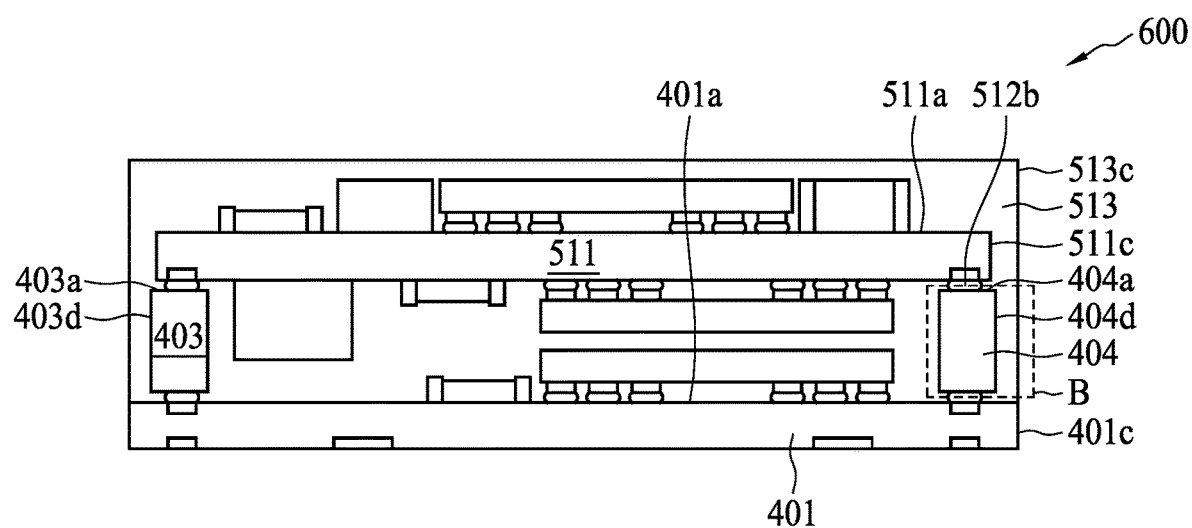
FIG. 6(a) illustrates a cross-sectional view of a semiconductor package according to some embodiments of the present disclosure.
Figure 6B:
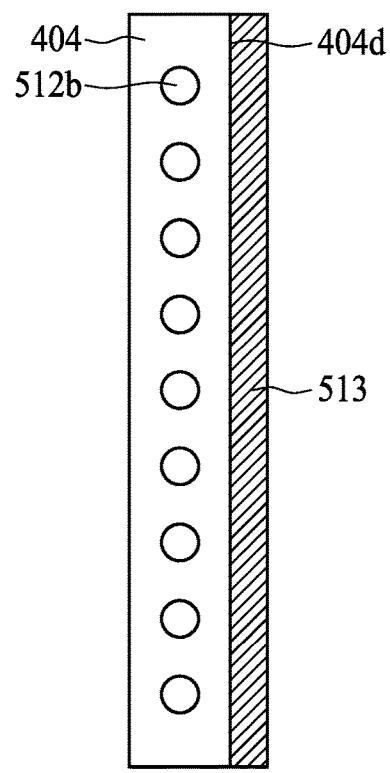
FIG. 6(b) illustrates a top view of region B of an interposer element illustrated in FIG. 6(a) according to some embodiments of the present disclosure.

FIG. 6(a) illustrates a cross-sectional view of a semiconductor package according to some embodiments of the present disclosure. FIG. 6(b) illustrates a top view of region B of an interposer element illustrated in FIG. 6(a) according to some embodiments of the present disclosure. The semiconductor package 600 illustrated in FIG. 6(a) is similar to that illustrated in FIG. 5(a) with a difference including that the encapsulant 513 covers the interposer side surface 403d, 404d of the interposer element 403, 404 entirely. In some embodiments, the encapsulant 513 surrounds the interposer element 403, 404. In some embodiments, the encapsulant 513 surrounds the interposer element 403, 404 and covers at least a portion of the first surface 401a of the first substrate 401. In some embodiments, the encapsulant 513 surrounds the interposer element 403, 404 and the second substrate 511 and covers at least a portion of the first surface 401a of the first substrate 401. In some embodiments, the encapsulant 513 surrounds the interposer element 403, 404 and the second substrate 511 and covers at least a portion of the first surface 401a of the first substrate 401 and at least a portion of the first surface 511a of the second substrate 511. In some embodiments, the encapsulant 513 surrounds the interposer element 403, 404 and covers at least a portion of the first surface 401a of the first substrate 401 and at least a portion of the first surface 511a of the second substrate 511, where the second substrate side surface 511c is exposed from the encapsulant 513. In some embodiments, the encapsulant 513 covers the first surface 511a of the second substrate 511, the second substrate side surface 511c, the second surface 403a, 404a of the interposer element 403, 404, and the interposer element side surface 404d, 403d entirely (e.g., the second substrate 511 and the interposer element 403, 404 are embedded in the encapsulant 513). In some embodiments, the short side of the interposer element 403, 404 retracts from a side surface of the encapsulant 513 by a distance ranging from 0 mm to 0.01 mm.

Figure 7A:
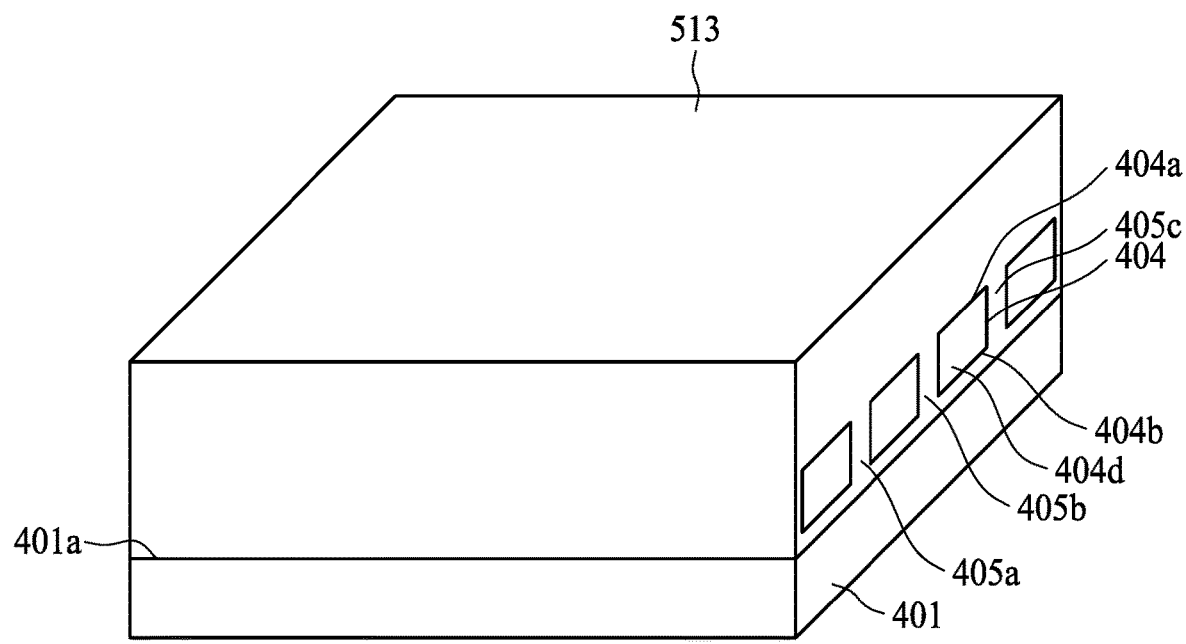
FIG. 7(a) illustrates a perspective view of region A of an interposer element illustrated in FIG. 5(a) according to some embodiments of the present disclosure.

FIG. 7(a) illustrates a perspective view of region A of an interposer element illustrated in FIG. 5(a) according to some embodiments of the present disclosure. The interposer element 404 is disposed adjacent to the first surface 401a of the first substrate 401. The interposer element 404 includes at least one slot 405a, 405b, 405c extending from the second surface 404a to the first surface 404b of the interposer element 404. The encapsulant 513 may be disposed in the slot 405a, 405b, 405c. In some embodiments, the slot 405a, 405b, 405c may be filled with encapsulant 513. The encapsulant 513 covers the second surface 404a and the first surface 404b of the interposer element 404 entirely and exposes at least a portion of the interposer side surface 404d. In some embodiments, the encapsulant 513 surrounds the interposer element 404 by filling the slot 405a, 405b, 405c up with it. By disposing at least one of the slots 405a, 405b, 405c in the interposer element 404, the material for forming the encapsulant 513 (e.g., a molding compound and filler) may be able to flow through the interposer element 404 directly from the second surface 404a to the first surface 404b through the slot 405a, 405b, 405c, which may allow the material for forming the encapsulant 513 to expand from the central area to the peripheral area between the interposer element 404 and the first substrate 401 so that the material for forming the encapsulant 513 can fill every space between the interposer element 404 and the first substrate 401. Therefore, the voids produced around a pad (or an electrical connector) due to the incomplete filling of the encapsulant 513 may be reduced or eliminated.

Figure 7B:
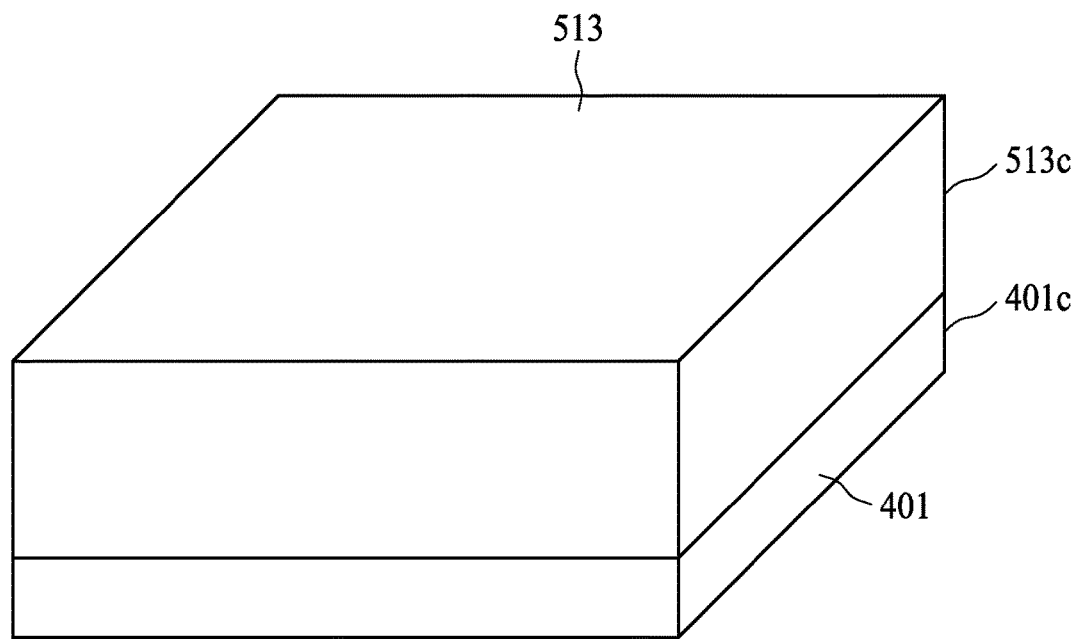
FIG. 7(b) illustrates a perspective view of region B of an interposer element illustrated in FIG. 6(a) according to some embodiments of the present disclosure.

FIG. 7(b) illustrates a perspective view of region B of an interposer element illustrated in FIG. 6(a) according to some embodiments of the present disclosure. The interposer element illustrated in FIG. 7(b) is similar to that illustrated in FIG. 7(a) with a difference including that the encapsulant 513 covers the interposer side surface 404d entirely. In some embodiments, the encapsulant 513 surrounds the interposer element 404 by filling the slot 405a, 405b, 405c up with it and by covering the interposer side surface 404d entirely. In some embodiments, the interposer element 404 is embedded in the encapsulant 513. In some embodiments, the encapsulant 513 has a side surface 513c in substantially the same plane with a first substrate side surface 401c of the first substrate 401.

Figure 8A:
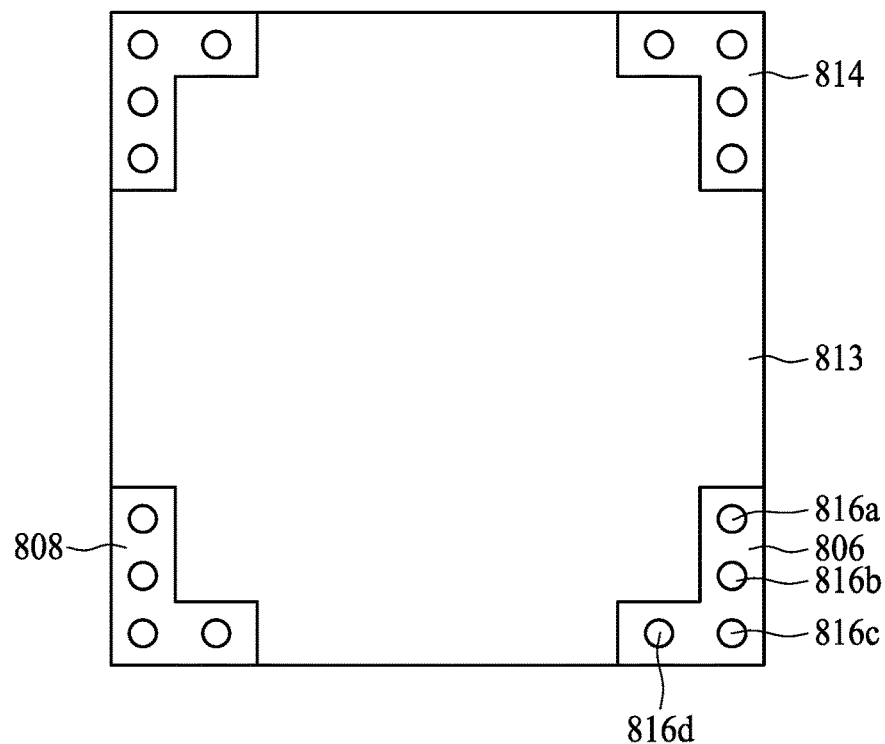
FIG. 8(a) illustrates a bottom view of a substrate according to some embodiments of the present disclosure.

FIG. 8(a) illustrates a bottom view of a substrate according to some embodiments of the present disclosure. The substrate includes a plurality of interposer elements 806, 808, 814. The interposer element 806, 808, 814 may have a shape that conforms to a corner of a semiconductor package unit. In some embodiments, the interposer element 806, 808, 814 has an L-like shape. The electrical connector 816*a*, 816*b*, 816*c*, 816*d* may be arranged at a position corresponding to a pad disposed adjacent to the interposer element 806 and in accordance with the shape of it. Since the interposer element 806, 808, 814 may be designed to have a shape that removes the portion of a pad where a void may occur during the subsequent molding (or encapsulating) process, the voids produced around a pad (or an electrical connector) due to the incomplete filling of the encapsulant 813 may be reduced or eliminated.

Figure 8B:
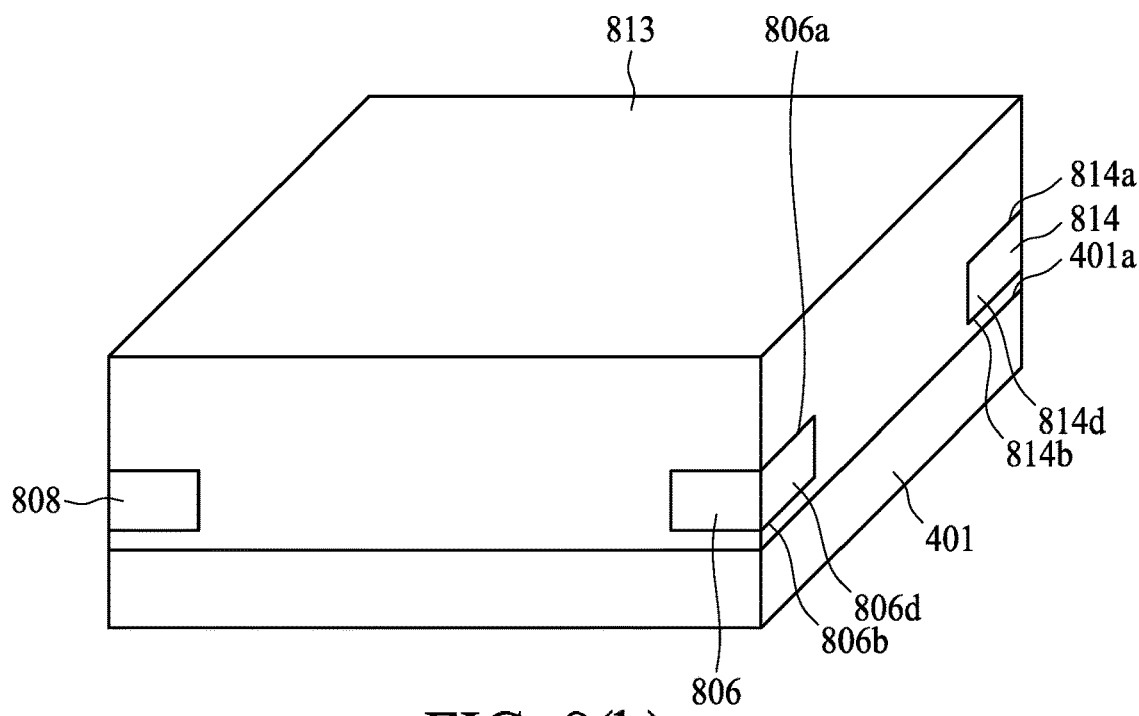
FIG. 8(b) illustrates a perspective view of a substrate illustrated in FIG. 8(a) according to some embodiments of the present disclosure.

FIG. 8(b) illustrates a perspective view of a substrate illustrated in FIG. 8(a) according to some embodiments of the present disclosure. The interposer element 806, 808, 814 may be disposed adjacent to the first surface 401*a* of the first substrate 401. The encapsulant 813 may cover the second surface 806*a*, 814*a* of the interposer element 806, 814 and the first surface 806*b*, 814*b* of the interposer element 806, 814 entirely and exposes at least a portion of the interposer side surface 806*d*, 814*d*.

Figure 9A:
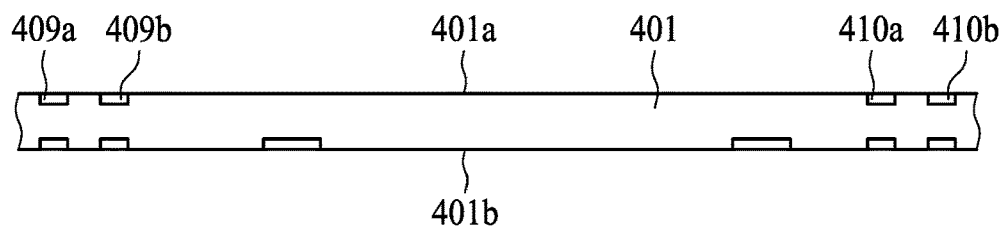
FIG. 9A, FIG. 9B-1, FIG. 9C-1, FIG. 9D-1, FIG. 9E-1, and FIG. 9F illustrate a method of manufacturing a semiconductor package such as the semiconductor package of FIG. 5.
Figures 1, 9B:
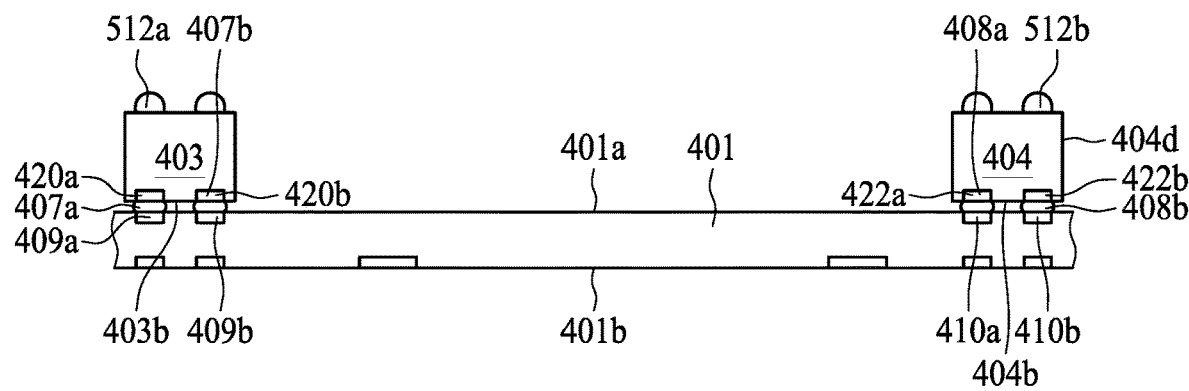
Figures 2, 9B:
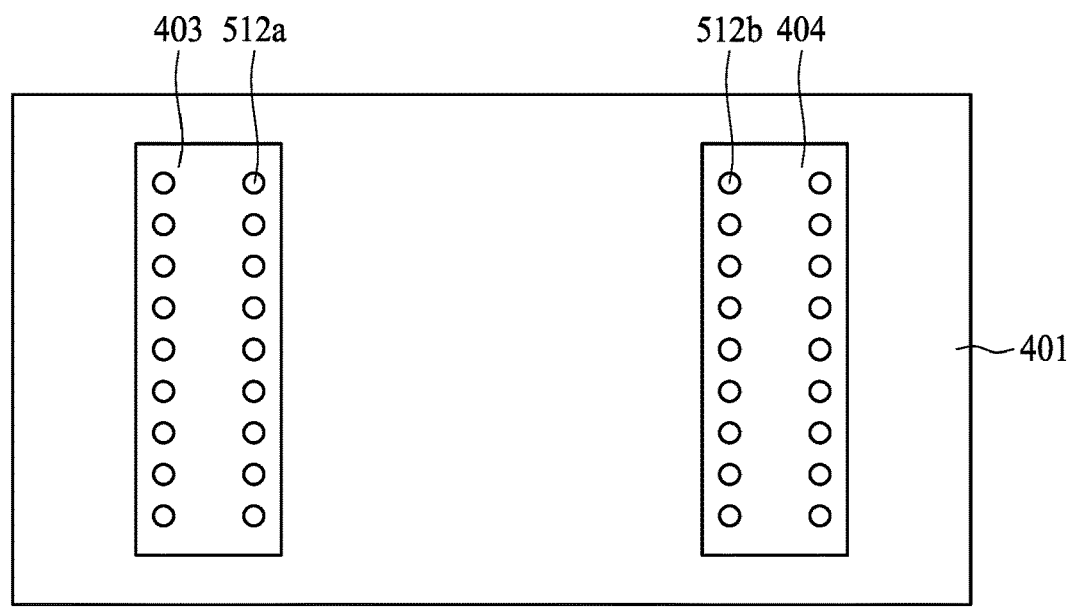
Figures 1, 9C:
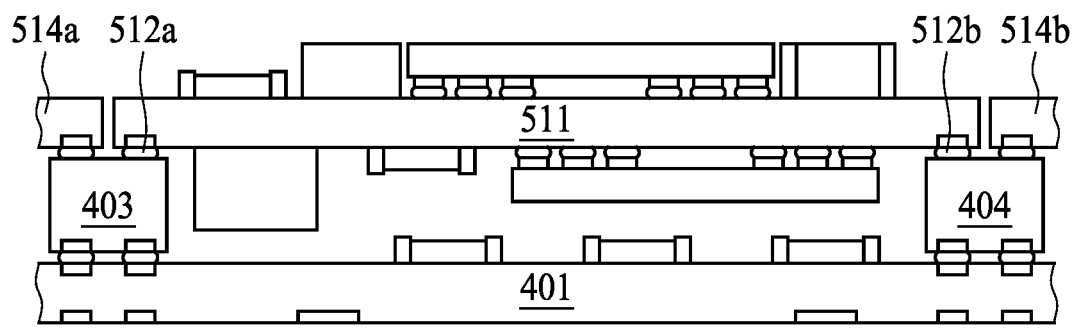
Figures 2, 9C:
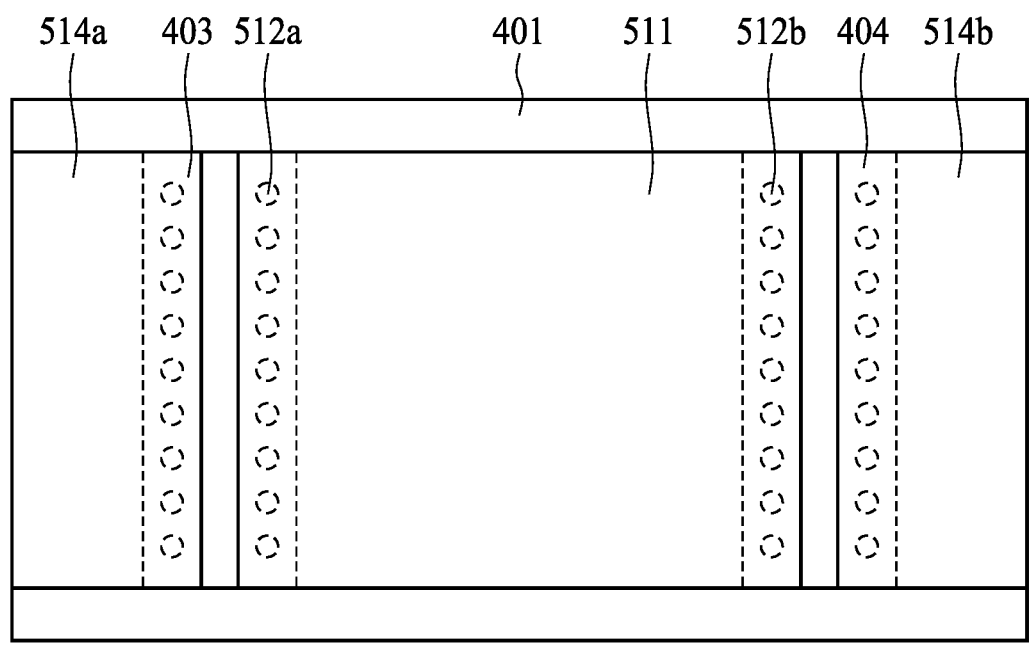
Figures 1, 9D:
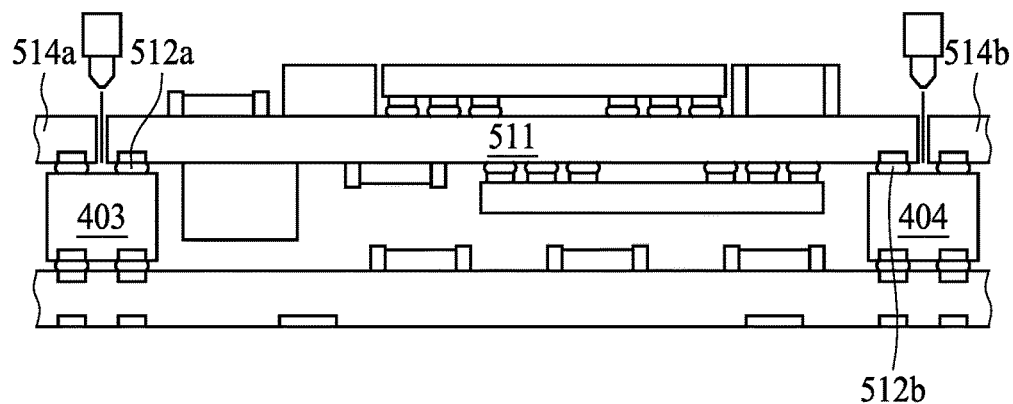
Figures 2, 9D:
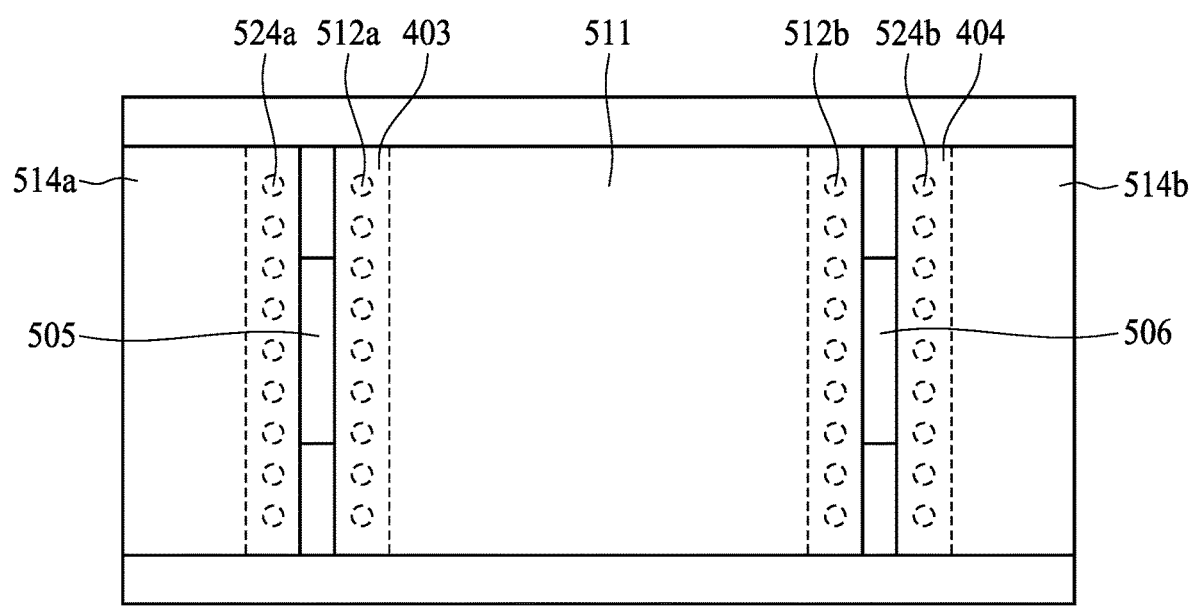
Figures 1, 9E:
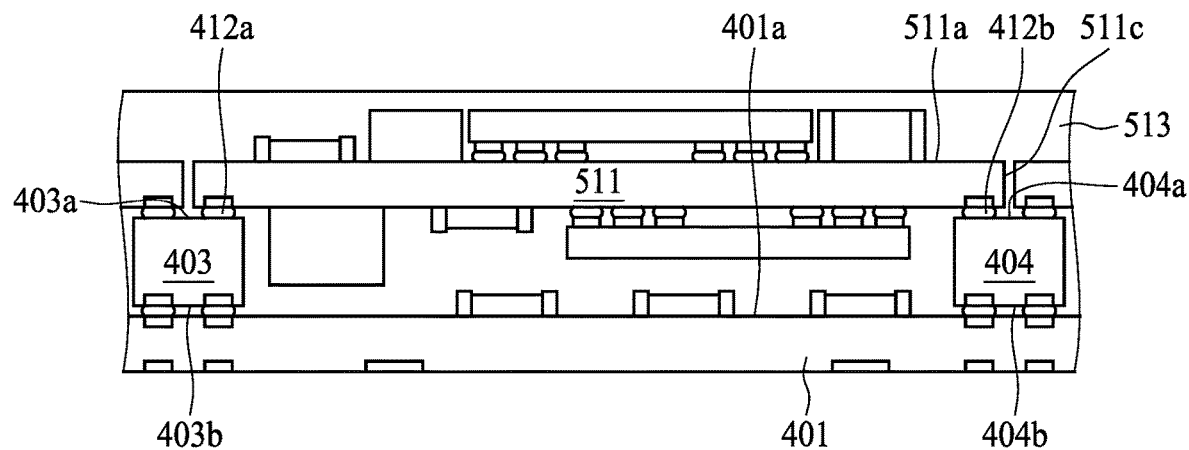
Figures 2, 9E:
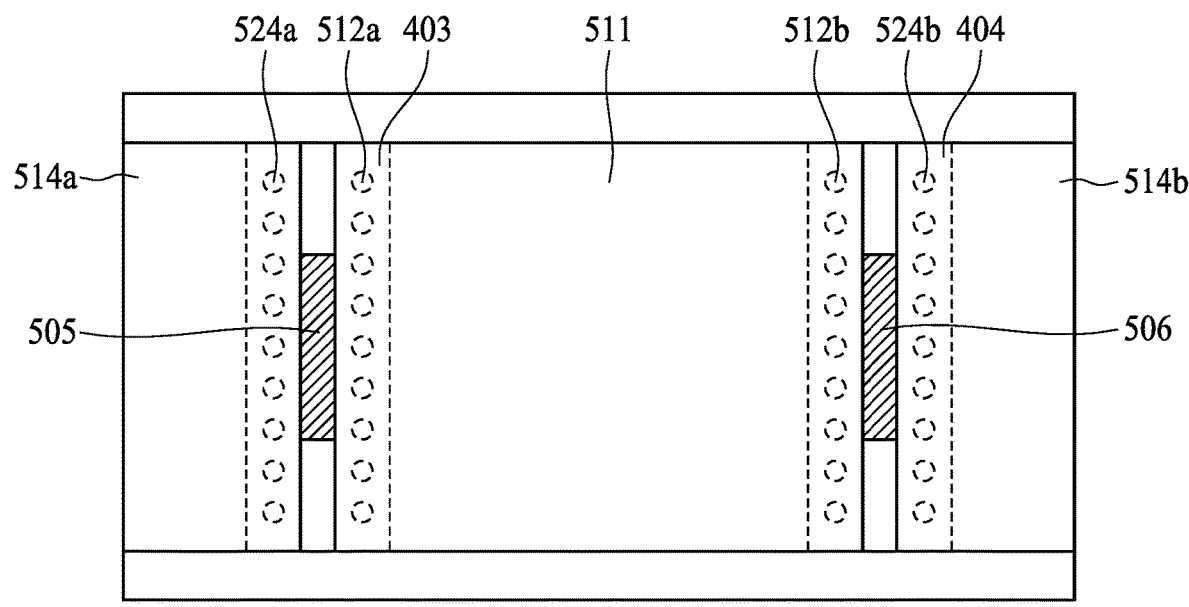

FIGS. 9A-9F illustrate a method of manufacturing a semiconductor package such as the semiconductor package of FIG. 5. FIG. 9B-2 illustrates a top view of FIG. 9B-1 according to some embodiments of the present disclosure. FIG. 9C-2 illustrates a top view of FIG. 9C-1 according to some embodiments of the present disclosure. FIG. 9D-2 illustrates a top view of FIG. 9D-1 according to some embodiments of the present disclosure. FIG. 9E-2 illustrates a top view of FIG. 9E-1 according to some embodiments of the present disclosure.

Referring to FIG. 9A, a first substrate 401 is provided. The first substrate 401 has a first surface 401*a* and a second surface 401*b* opposite to the first surface 401*a*. The first substrate 401 may be a printed circuit board, a unit substrate, a strip substrate, or a combination thereof. In some embodiments, the first substrate 401 is a strip substrate. The first substrate 401 may include at least one second pad 409*a*, 409*b*, 410*a*, 410*b* disposed adjacent to the first surface 401*a* of the first substrate 401.

Referring to FIG. 9B-1 and FIG. 9B-2, an interposer element 403, 404 is disposed adjacent to the first surface 401*a* of the first substrate 401. In some embodiments, the interposer element 403, 404 electrically connects to the first surface 401*a* of the first substrate 401 through the first electrical connector 407*a*, 407*b*, 408*a*, 408*b* disposed between the first pads 420*a*, 420*b*, 422*a*, 422*b* disposed adjacent to the first surface 403*b*, 404*b* of the interposer element 403, 404 and the second pad 409*a*, 409*b*, 410*a*, 410 disposed adjacent to the first surface 401*a* of the first substrate 401. In some embodiments, at least one second electrical connector 512*a*, 512*b* is disposed adjacent to the second surface 403*a*, 404*a* of the interposer element 403, 404 so as to provide electrical connection to another substrate. The second electrical connector 512*a*, 512*b* may be a pillar or a solder/stud bump. In some embodiments, the second electrical connector 512*a*, 512*b* is a solder bump.

Referring to FIG. 9C-1 and FIG. 9C-2, a second substrate 511, 514*a*, 514*b* (e.g., an unit substrate) is disposed adjacent to the interposer element 403, 404. In some embodiments, the second semiconductor element 511 electrically connects to the interposer element 403, 404 through the second electrical connector 512*a*, 512*b*.

Referring to FIG. 9D-1 and FIG. 9D-2, at least one slot 506 such as the one illustrated in FIG. 1(b), FIG. 2(a)-2(d), and FIG. 3 is disposed in the interposer 403, 404. The slot 506 may be disposed by a mechanical drilling technique, a laser drilling technique, or other suitable techniques. In some embodiments, the slot 506 is disposed by applying the laser or mechanical drilling technique more than once to have required width and length. Although in this embodiment, the slot 506 is formed after disposing the interposer element 403, 404 on the first substrate, it should be noted that the slot 506 can also be formed in the interposer element 403, 404 prior to disposing the interposer element 403, 404 on the first substrate. Compared to a mechanical drilling technique, a laser drilling technique has advantages of simpler processing procedures and more cost effectiveness as less dust would be produced when applying a laser drilling technique and an additional cleaning process may not be required afterwards.

Referring to FIG. 9E-1 and FIG. 9E-2, a molding process is performed to form an encapsulant 513 covering at least a portion of the first surface 401*a* of the first substrate 401, at least a portion of the first surface 511*a* of the second substrate 511, at least a portion of the second surface 403*a*, 404*a* of the interposer element 403, 404, and at least a portion of the second substrate side surface 511*c*. Since the interposer element 403, 404 are provided with at least one slot 506 extending from the second surface 403*a*, 404*a* to the first surface 403*b*, 404*b*, the molding compound and filler for forming the encapsulant 513 could flow from the second surface 403*a*, 404*a* to the first surface 403*b*, 404*b* directly through the slot 506, which may reduce or eliminate the void produced around an electrical connector between the interposer element 403, 404 and the first substrate 401.

Figure 9F:
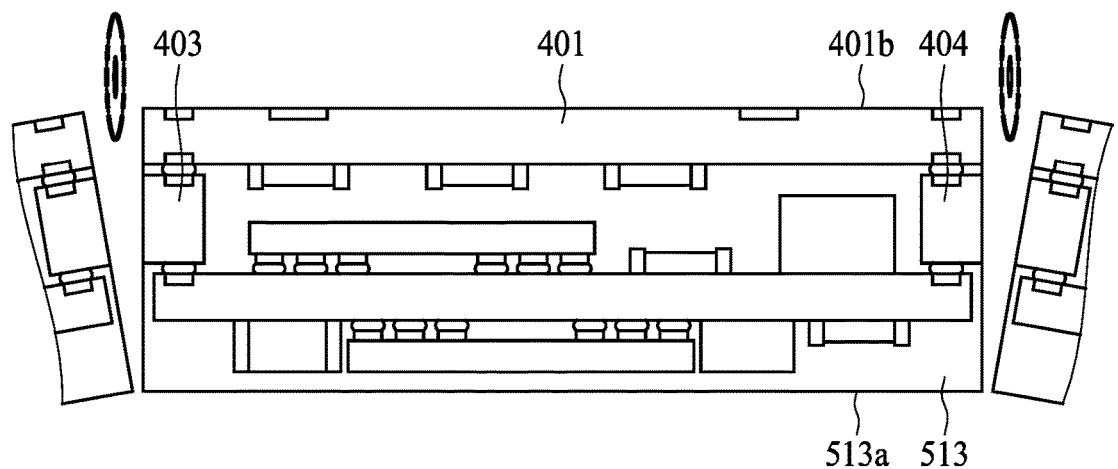

Referring to FIG. 9F, a singularizing process (e.g., a sawing process) is performed from the second surface 401*b* of the first substrate 401 toward the encapsulant top surface 513*a* to obtain individual semiconductor package units. In some embodiments, a sawing process is performed and a saw with a width larger than the width of the slot 506 is utilized. Subsequently, a semiconductor package (e.g., a semiconductor device 500 as is illustrated in FIG. 5) can be obtained.

Figure 10A:
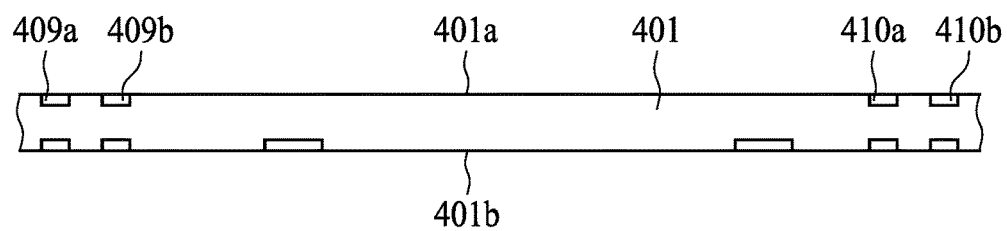
Figure 10B:
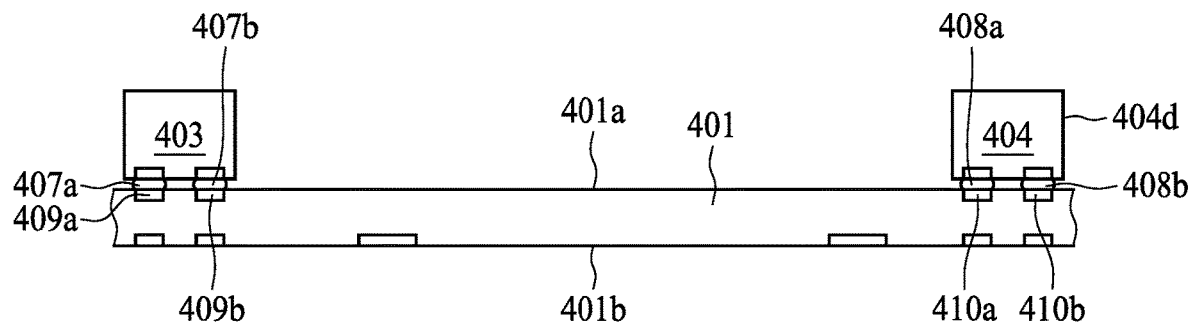
Figures 1, 10C:
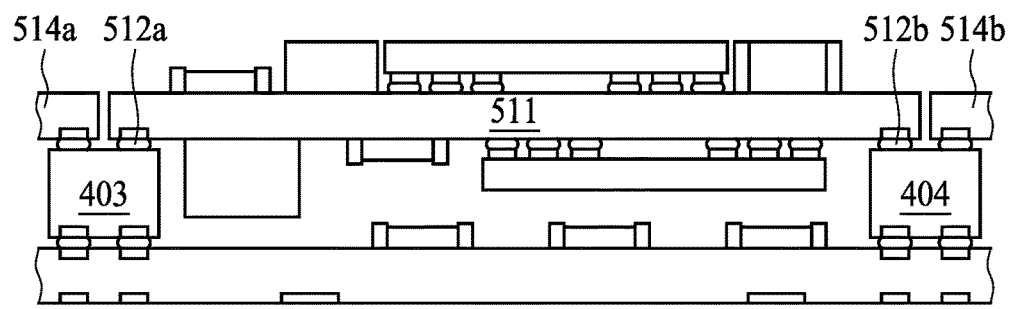
Figures 2, 10C:
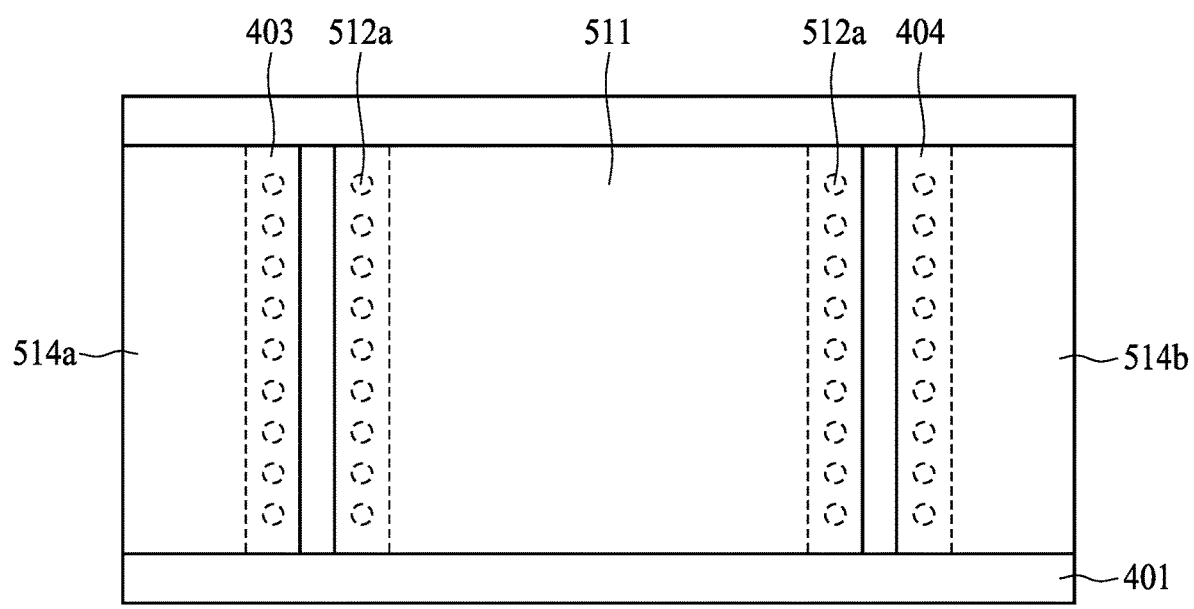
Figures 1, 10D:
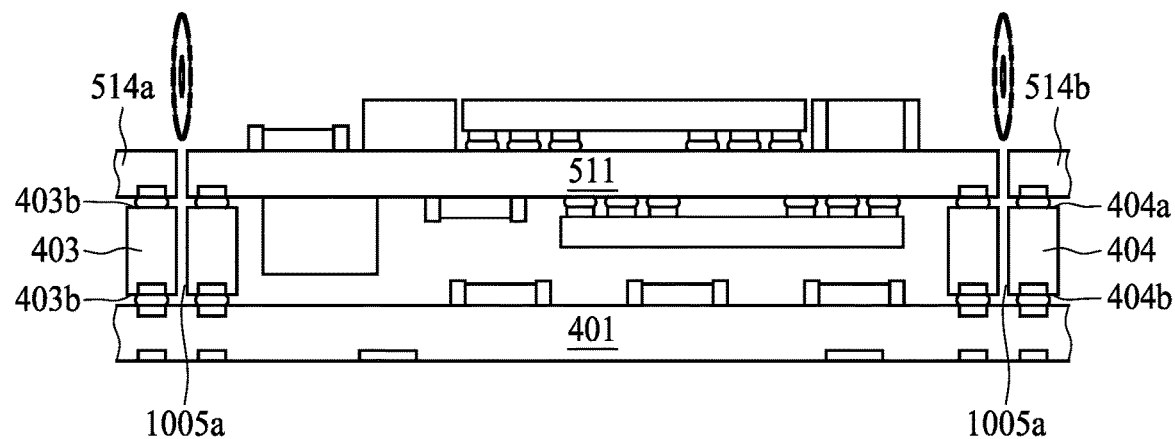
Figures 2, 10D:
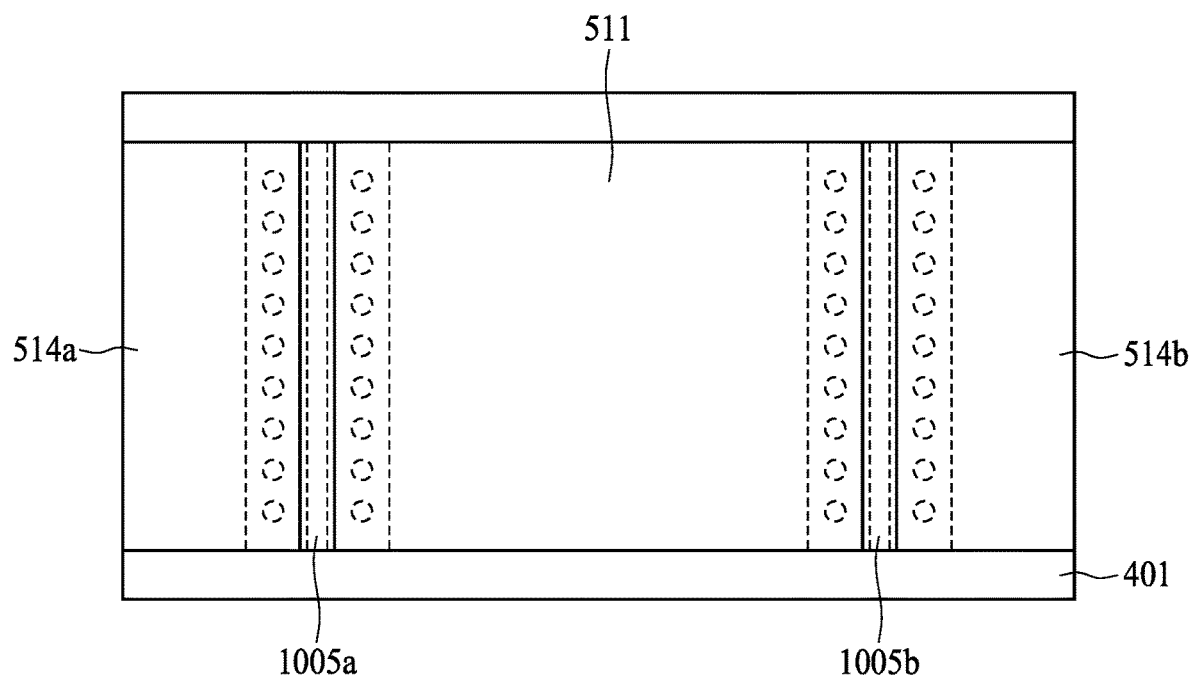
Figures 1, 10E:
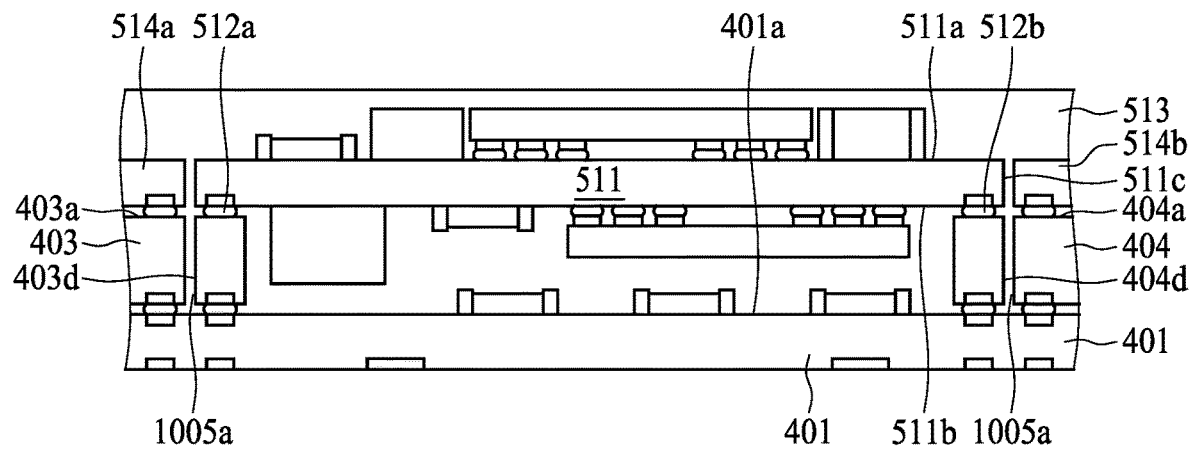
Figures 2, 10E:
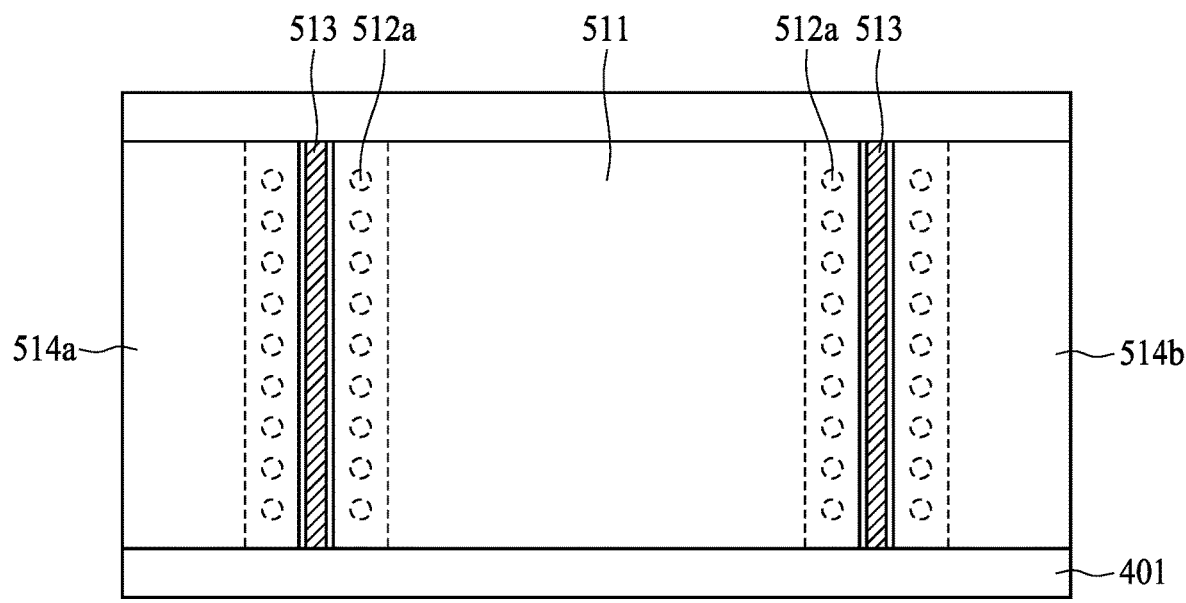

FIGS. 10A-10F illustrate a method of manufacturing a semiconductor package such as the semiconductor package of FIG. 6. FIG. 10C-2 illustrates a top view of FIG. 10C-1 according to some embodiments of the present disclosure. FIG. 10D-2 illustrates a top view of FIG. 10D-1 according to some embodiments of the present disclosure. FIG. 10E-2 illustrates a top view of FIG. 10E-1 according to some embodiments of the present disclosure.

Referring to FIG. 10A-10C-2, the processes illustrated in FIG. 10A-10C-2 for providing the first substrate 401, disposing the interposer element 403, 404, and providing the second substrate 511 are similar to those illustrated in FIG. 9A-9C-2, which are not described repeatedly for brevity.

Referring to FIG. 10D-1 and FIG. 10D-2, a sawing process is performed from the second surface 403*a*, 404*a* of the interposer element 403, 404 toward the first surface 403*b*, 404*b* to cut through the interposer element 403, 404, which may form a slit 1005*a*, 1005*b* therein.

Referring to FIG. 10E-1 and FIG. 10E-2, a molding process is performed to form an encapsulant 513 covering at least a portion of the first surface 401*a* of the first substrate 401, at least a portion of the first surface 511*a* of the second substrate 511, at least a portion of the second surface 403*a*, 404*a* of the interposer element 403, 404, at least a portion of the second substrate side surface 511*c*, and at least a portion of the interposer side surface 403d, 404d. In some embodiments, the encapsulant 513 surrounds the interposer element 403, 404. Since the interposer element 403, 404 are provided with at least one slit 1005a, 1005b extending from the second surface 403a, 404a to the first surface 403b, 404b of the interposer element 403, 404, the molding compound and filler for forming the encapsulant 513 can flow from the second surface 403a, 404a to the first surface 403b, 404b of the interposer element 403, 404 directly through the slit 1005a, 1005b and fills the space between the interposer 403, 404 and the first substrate 401, which may reduce or eliminate the molding void produced around an electrical connector between the interposer element 403, 404 and the first substrate 401.

Figure 10F:
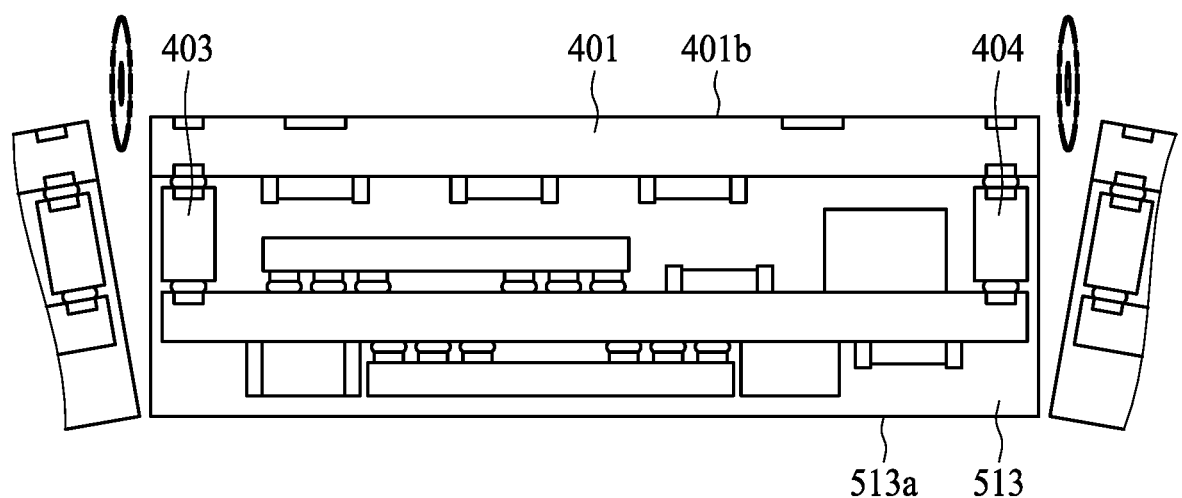

Referring to FIG. 10F, a singularizing process (e.g., a sawing process) is performed from the second surface 401b of the first substrate 401 toward the encapsulant top surface 513a to obtain individual semiconductor package units. Subsequently, a semiconductor package (e.g., a semiconductor device 600 as is illustrated in FIG. 6) can be obtained.

As used herein and not otherwise defined, the term "substantially" is used to describe and account for small variations. When used in conjunction with an event or circumstance, the term can encompass instances in which the event or circumstance occurs precisely as well as instances in which the event or circumstance occurs to a close approximation. For example, when used in conjunction with a numerical value, the term can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 no greater than 1 or no greater than 0.5 µm.

As used herein, the singular terms "a," "an," and "the" may include plural referents unless the context clearly dictates otherwise. In the description of some embodiments, a component provided "on or "over" another component can encompass cases where the former component is directly on (e.g., in physical contact with) the later component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor package, comprising:
a first substrate;
an interposer element disposed adjacent to the first substrate, the interposer element having a slot, a first lateral surface exposed from the slot, and a second lateral surface opposite to the first lateral surface;
an encapsulant covering the first lateral surface, the second lateral surface and extending between the first substrate and the interposer element; and
a second substrate disposed adjacent to the interposer element, wherein an area of the second substrate projected along a direction substantially vertical to the first substrate does not overlap the slot of the interposer element.

2. The semiconductor package of claim 1, wherein the encapsulant includes a plurality of fillers and a width of the slot is larger than an average size of the fillers.

3. The semiconductor package of claim 1, wherein the first lateral surface substantially aligns with a side surface of the first substrate and the first lateral surface has at least one recess and a portion of the encapsulant is in the recess.

4. The semiconductor package of claim 3, wherein the encapsulant has an encapsulant side surface and the encapsulant side surface is substantially coplanar with the side surface of the first substrate.

5. The semiconductor package of claim 1, wherein the encapsulant is in the slot and has a surface exposed from a surface of the interposer element that connects the first lateral surface to the second lateral surface.

6. The semiconductor package of claim 1, wherein the interposer element has a long side and a short side, wherein the short side retracts from a side surface of the encapsulant by a distance ranging from 0 mm to 0.01 mm.

7. The semiconductor package of claim 1, wherein the slot has a first opening at a first surface of the interposer element and a second opening at a second surface of the interposer element that is opposite to the first surface of the interposer element and a width of the first opening is different from a width of the second opening.

8. The semiconductor package of claim 7, wherein the width of the second opening is greater than the width of the first opening.

9. A method of manufacturing a semiconductor package, comprising:
providing an interposer element, the interposer element having a first surface and a second surface opposite to the first surface;
disposing the interposer element adjacent to a first substrate;
forming a slot extending from the first surface to the second surface after the step of disposing the interposer element adjacent to the first substrate;
disposing a second substrate adjacent to the interposer element; and
flowing an encapsulant through the slot and between the first substrate and the interposer element.

* * * * *